(12) United States Patent
Moriguchi et al.

(10) Patent No.: US 6,170,072 B1
(45) Date of Patent: Jan. 2, 2001

(54) LOGIC CIRCUIT VERIFICATION APPARATUS AND METHOD FOR SEMICONDUCTOR INTEGRATED CIRCUIT

(75) Inventors: Yasuo Moriguchi; Toshinori Inoshita; Yoshio Inoue, all of Tokyo (JP)

(73) Assignee: Mitsubishi Denki Kabushiki Kaisha, Tokyo (JP)

( * ) Notice: Under 35 U.S.C. 154(b), the term of this patent shall be extended for 0 days.

(21) Appl. No.: 09/201,092

(22) Filed: Nov. 30, 1998

(30) Foreign Application Priority Data

Jun. 26, 1998 (JP) .................................................. 10-180248

(51) Int. Cl.⁷ .................................................. G01R 31/28
(52) U.S. Cl. .................................................. 714/724
(58) Field of Search .................................. 714/724, 731, 714/785

(56) References Cited

U.S. PATENT DOCUMENTS

| | | | |
|---|---|---|---|
| 5,940,370 | * 8/1999 | Curtis et al. | 370/231 |
| 6,012,833 | * 1/2000 | Yoshikawa | 364/468.28 |
| 6,047,247 | * 4/2000 | Iwanishi et al. | 702/117 |

FOREIGN PATENT DOCUMENTS

| | | |
|---|---|---|
| 4-288678 | 10/1992 | (JP). |
| 5-151301 | 6/1993 | (JP). |
| 6-60143 | 3/1994 | (JP). |

\* cited by examiner

*Primary Examiner*—Phung M. Chung
(74) *Attorney, Agent, or Firm*—McDermott, Will & Emery

(57) ABSTRACT

There is constituted a logic circuit verification apparatus designed for checking a semiconductor integrated circuit including a core and a new circuit. The core has a internal circuit in which logic and timing have already been verified. The apparatus is provided with a section for extracting from the cells of the core timing cells which are required to be subjected to timing verification when the core is used in combination with the new circuit. The apparatus is also provided with a section for extracting from the cells of the core delay cells which are required to be subjected to time delay calculation when the core is used in combination with the new circuit. At the time of simulation, predetermined processing is performed solely with regard to the extracted cells.

12 Claims, 8 Drawing Sheets

```
module
B0(CLK1,CLK2,CLK3,DATA1,DATA2,DATA3,DATA4,RES1,OUT1,OUT2,OUT3,OUT4);
input CLK1,CLK2,CLK3,DATA2,DATA4,RES1;
output OUT3,OUT4;
input [3:0] DATA1,DATA3;
output [7:0] OUT1,OUT2;
reg [3:0] reg1,reg2;
reg [7:0] reg4,reg5,out1,out2;
assign out1 = reg7;
assign out2 = reg8;
always @(posedge CLK1) begin
reg1 <=DATA1+DATA2;
reg2 <=DATA3+α;
reg4 <=reg1*reg2;
reg5 <=reg1/reg2;
end always @(posedge CLK2) begin
reg3 <=DATA4+β;
reg6 <=reg2+reg3;

end always @(posedge CLK3) begin end endmodule
```

FIG.8

```
module B2(CLK1,A,B,C,D);
input CLK1;
input [3:0] A,B;
output [7:0] C,D;
reg [7:0] reg4,reg5;
always @(posedge CLK1)begin
reg4 <= A*B;
reg5 <= A/B;
end
assign C = reg4*reg5
assign D = reg4/reg5
endmodule
```

FIG.9

LOGIC CIRCUIT VERIFICATION APPARATUS AND METHOD FOR SEMICONDUCTOR INTEGRATED CIRCUIT

BACKGROUND OF THE INVENTION

1. Field of the Invention

The present invention generally related to a logic circuit verification apparatus and method for a semiconductor integrated circuit, and more particularly, to a logic circuit verification apparatus and method suitable for use in checking a logic circuit of a semiconductor integrated circuit which includes, as part of its circuitry, a circuit being already verified with regard to given points.

2. Description of the Background Art

In the process of designing a semiconductor integrated circuit, a logic circuit is verified as to whether or not the circuit operates normally after a circuit layout is determined. In the logic circuit verification stage, there are initially performed (1) processing for calculating a delay time arising on the way of propagation of a signal through cells, in consideration of the layout of individual cells; and (2) processing for calculating the standards (e.g., a set-up time and a hold time) by which registers included in the circuit operate normally, in consideration of the layout of individual registers. The standards will be hereinafter referred to as a "timing verification value."

During the verification of the logic circuit, after completion of calculation of the foregoing delay time and the timing verification value, circuit operations are simulated through use of the thus-calculated values under circumstances where a clock signal and input data change at predetermined timing. Together with execution of the simulation, the logic of circuitry and timing at which signals are propagated are verified. Such a verification will be hereinafter referred to as a "logic-and-timing verification."

Intellectual property (IP), such as a CPU core, is used for a portion of a semiconductor integrated circuit. The IP is a functional block which incorporates a plurality of combinational logic gates and registers and which has already been verified with regard to the logic and timing of the internal circuit. Such a functional block will be hereinafter referred to as a "core."

In the designing process of a semiconductor integrated circuit including a core as part of its circuitry, a logic of a circuit in which a newly designed part and the core are in combination must be verified. In a conventional logic circuit verification, all the cells incorporated in the core are subjected to calculation of a delay time and a timing verification value. For this reason, there has been employed a method of checking the logic and timing of circuitry after calculation of a delay time and a timing verification value with regard to all the cells.

However, the internal logic and timing of the core has already been completed as mentioned previously. Accordingly, in checking whether or not a semiconductor integrated circuit comprising a newly designed circuit and the core in combination operates normally, not all the cells incorporated in the core necessarily have to be subjected to logic circuit verification. In this regard, the conventional method by which all the cells are subjected to logic circuit verification can be improved so as to shorten a time for verification.

SUMMARY OF THE INVENTION

The present invention has been conceived to solve the foregoing problem, and a general object of the present invention is to provide a novel and useful logic circuit verification apparatus and method for semiconductor device.

A more specific object of the present invention is to provide a logic circuit verification apparatus which shortens the time required for logic circuit verification, by extracting the cells required for verification from among a plurality of cells incorporated in the core and subjecting the extracted cells to the verification.

The above objects of the present invention are achieved by a logic circuit verification apparatus which performs logic circuit verification of a semiconductor integrated circuit which comprises a core having a plurality of combinational logic gates and a plurality of registers and whose internal circuit has already verified, and a new circuit to be combined with the core. The logic circuit verification includes a timing cell extraction section for extracting from the cells of the core timing cells which are required to be subjected to timing verification when the core is used in combination with the new circuit; and a delay cell extraction section for extracting from the cells of the core delay cells which are required to be subjected to time delay calculation when the core is used in combination with the new circuit.

The secondary object of the present invention is to provide a logic circuit verification method which enables shortening of the time required for logic circuit verification by extracting the cells required for verification from among a plurality of cells incorporated in the core and subjecting the extracted cells to the verification.

The above objects of the present invention are achieved by a method of logic circuit verification for performing logic circuit verification of a semiconductor integrated circuit which comprises a core having a plurality of combinational logic gates and a plurality of registers and whose internal circuit has already verified, and a new circuit to be combined with the core. The method includes a step for extracting from the cells of the core timing cells which are required to be subjected to timing verification when the core is used in combination with the new circuit; and a step for extracting from the cells of the core delay cells which are required to be subjected to time delay calculation when the core is used in combination with the new circuit.

Other objects and further features of the present invention will be apparent from the following detailed description when read in conjunction with the accompanying drawings.

BRIEF DESCRIPTION OF THE DRAWINGS

FIG. 8 shows one example of RTL description according to the module B0 shown in FIG. 7; and FIG. 9 shows one example of RTL description according to the module B2 shown in FIG. 7.

DESCRIPTION OF THE PREFERRED EMBODIMENTS

Figure 1:
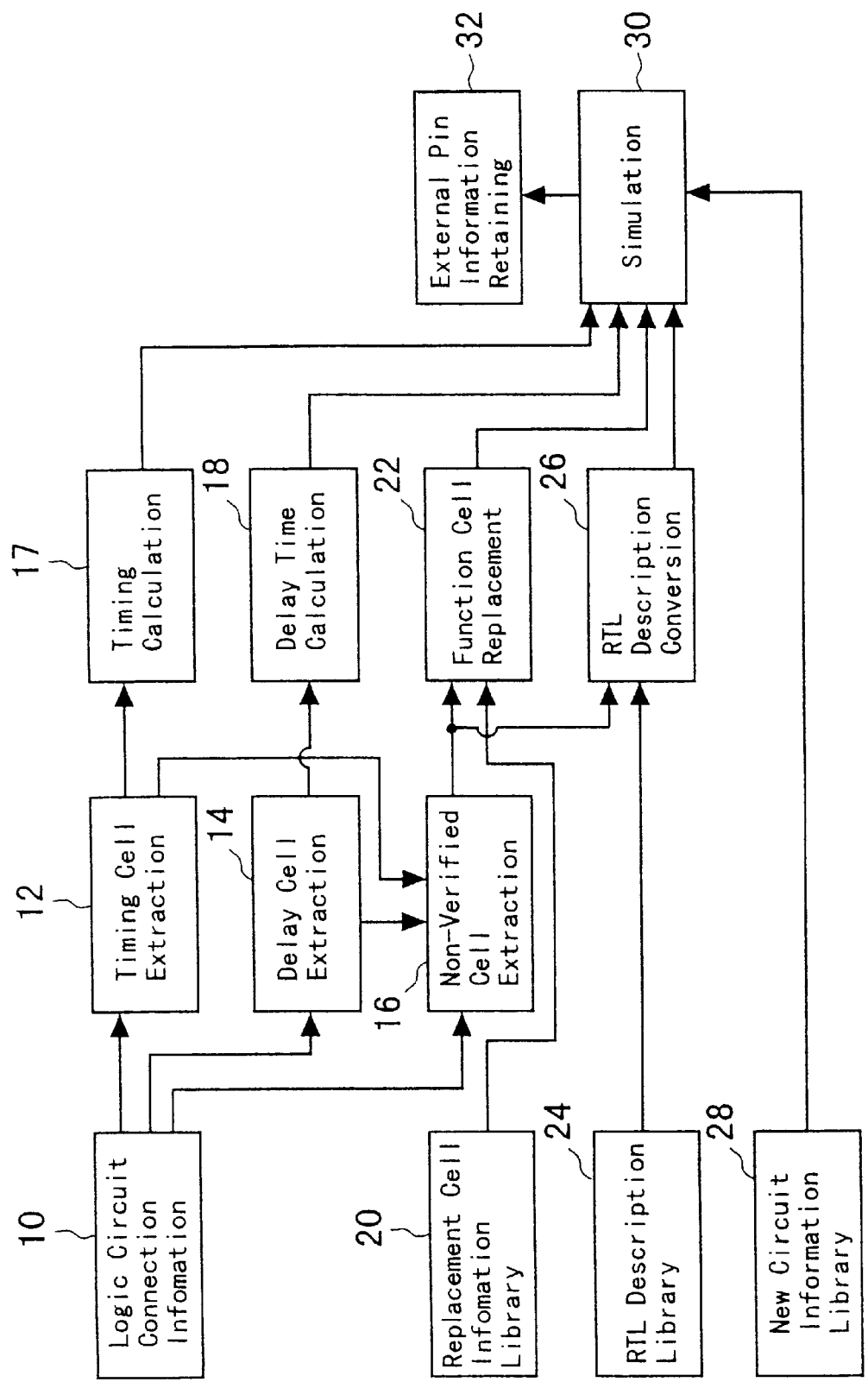
FIG. 1 is a block diagram showing a logic circuit verification apparatus according to a first embodiment of the present invention.

In the following, principles and embodiments of the present invention will be described with reference to the accompanying drawings. Throughout the drawings, the same reference numerals designate the same or corresponding elements, and repetition of their explanations are omitted.

First Embodiment

FIG. 1 is a block diagram showing a logic circuit verification apparatus according to a first embodiment of the present invention. The logic circuit verification apparatus according to the first embodiment is suitable for performing logic circuit verification with regard to a semiconductor integrated circuit incorporating as part of its circuitry a "core," i.e., "a functional block which includes a plurality of combinational logic gates and a plurality of registers and in which an internal logic and timing have already verified." The logic circuit verification apparatus according to the first embodiment can be implemented through use of a known computer system.

As shown in FIG. 1, the logic circuit verification apparatus according to the first embodiment comprises a logic circuit connection information section 10. The logic circuit connection information section 10 stores a net list regarding the core. Circuitry to be incorporated into the core is implemented by combination of cells such as AND gates, OR gates or flip-flops (F/F).

According to the net list stored in the logic circuit connection information section 10, the following information items can be acquired.

(1) The function of each cell, (2) Information regarding connections among cells, (3) Drive capability of each cell, (4) Information required for calculating the delay time of each cell, and (5) Information required to calculate a timing verification value related to a cell which requires timing verification.

In the logic circuit verification apparatus according to the first embodiment, the net list is supplied to a section 12 for extracting cells to be subjected to timing verification (hereinafter referred to simply as a "timing cell extraction section 12"), a section 14 for extracting cells to be subjected to delay time calculation (hereinafter referred to simply as a "delay cell extraction section 14"), and a section 16 for extracting cells not to be verified (hereinafter referred to simply as a "non-verified cell extraction section 16").

The timing cell extraction section 12 is a block for extracting cells which requires timing verification (i.e., timing cells) from among the constituent elements of a core on the basis of the net list regarding the core. The delay cell extraction section 14 is a block for extracting cells which requires delay time calculation (i.e., delay time cells) from among gates constituting the core on the basis of the net list related to the core. The non-verified extraction section 16 is a block for extracting cells which requires neither timing verification nor delay time calculation (i.e., non-verified cells) from among the constituent elements of the core.

The information of the timing cells is supplied to a timing calculation section 17. The information of the delay time cells is supplied to a delay time calculation section 18. The timing calculation section 17 calculates a timing verification value of an individual cell to be subjected to timing verification, through use of the information included in the net list. In contrast, the delay time calculation section 18 calculates a delay time calculation value of an individual cell to be subjected to delay time calculation, through use of the information included in the net list.

The logic circuit verification apparatus according to the first embodiment comprises a replacement cell information library 20. An individual cell constituting the core is defined in terms of various characteristics such as drive capability, and the delay time characteristics or the dynamic characteristics, as well as in terms of function. The replacement cell information library 20 stores information required for replacement the cells of the core with cells defined solely in terms of function (hereinafter referred to simply as "function cells"). The information will be hereinafter referred to as "replacement cell information."

The replacement cell information is fed to a function cell replacement section 22 together with the previously-described information regarding non-verified cells. The function cell replacement section 22 is a block for replacing the information regarding non-verified cells—which is obtained on the basis of the net list—with the information regarding function, on the basis of the replacement cell information.

The logic circuit verification apparatus according to the first embodiment has an RTL (Register Transfer Level) description library 24. The RTL description represents circuit function by means of descriptions corresponding to combinational logic gates which implements a specific function and descriptions related to data transfer among registers such as flip-flops or latches. In the process of designing a semiconductor integrated circuit, there is employed a method comprising steps of describing a circuit configuration to be implemented in the form of an RTL description beforehand, acquiring a net list by expanding the RTL description to a gate level, and performing verification of a logic circuit.

For this reason, there may be a case where the RTL description related to the core is already known during the phase of designing a semiconductor integrated circuit including a core. The RTL description library 24 is a block for storing the RTL description in a case where the RTL description of the core is already known. In a case where the RTL description related to the core has already been stored in the RTL description library 24, the information is supplied to an RTL description conversion section 26.

The RTL description conversion section 26 receives the information regarding non-verified cells extracted by the non-verified cell extraction section 16, together with the RTL description relating to the core. The RTL description conversion section 26 converts the information regarding the non-verified cells which can be obtained from the net list, i.e., the gate-level information regarding the non-verified cells to the RTL description.

The logic circuit verification apparatus according to the present embodiment has a new circuit information library 28. The new circuit information library 28 stores a net list regarding a circuit to be newly designed. The net list stored in the new circuit information library 28 is supplied to a simulation section 30.

The simulation section 30 receives the calculation result of the timing calculation section 17, the calculation result of the delay time calculation section 18, the replacement information produced by the function cell replacement section 22, and the conversion information produced by the RTL description conversion section 26, in addition to the net list related to a new circuit. The simulation section 30 performs the simulation of operation of a semiconductor integrated circuit including a core, i.e., simulation for the purpose of verifying the logic and timing of a circuit, on the basis of those information items described above.

The logic circuit verification apparatus according to the first embodiment has also an external pin information retaining section 32. The external pin information retaining section 32 is a block for storing information regarding signals supplied to external pins of a core while the simulation section 30 performs simulation for the purpose of a logic and timing verification.

Hereinafter, the processing performed by the logic circuit verification apparatus according to the first embodiment will be described in detail by reference to FIGS. 2 through 9.

Figure 2:
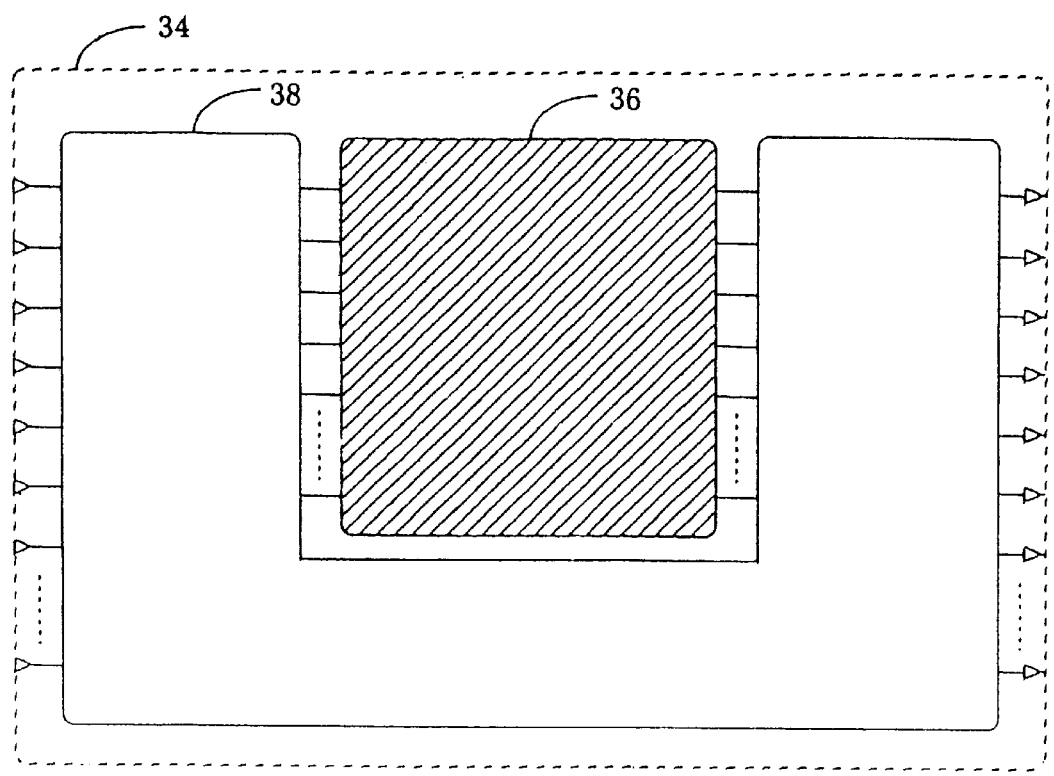
FIG. 2 is a general view of a semiconductor integrated circuit to be subjected to logic and timing verification in the first embodiment.

FIG. 2 is a general view of a semiconductor integrated circuit 34 to be subjected to logic and timing verification in the present embodiment. The semiconductor integrated circuit 34 has a core 36 and a new circuit 38. The core 36 is a functional block which has a plurality of combinational logic gates and a plurality of registers and in which logic and timing has already verified. In contrast, the new circuit 38 is a newly designed circuit. In the first embodiment, the logic and timing of the semiconductor integrated circuit 34 is performed at the instant when the net list regarding the new circuit 38 is obtained during the design process.

Figure 3:
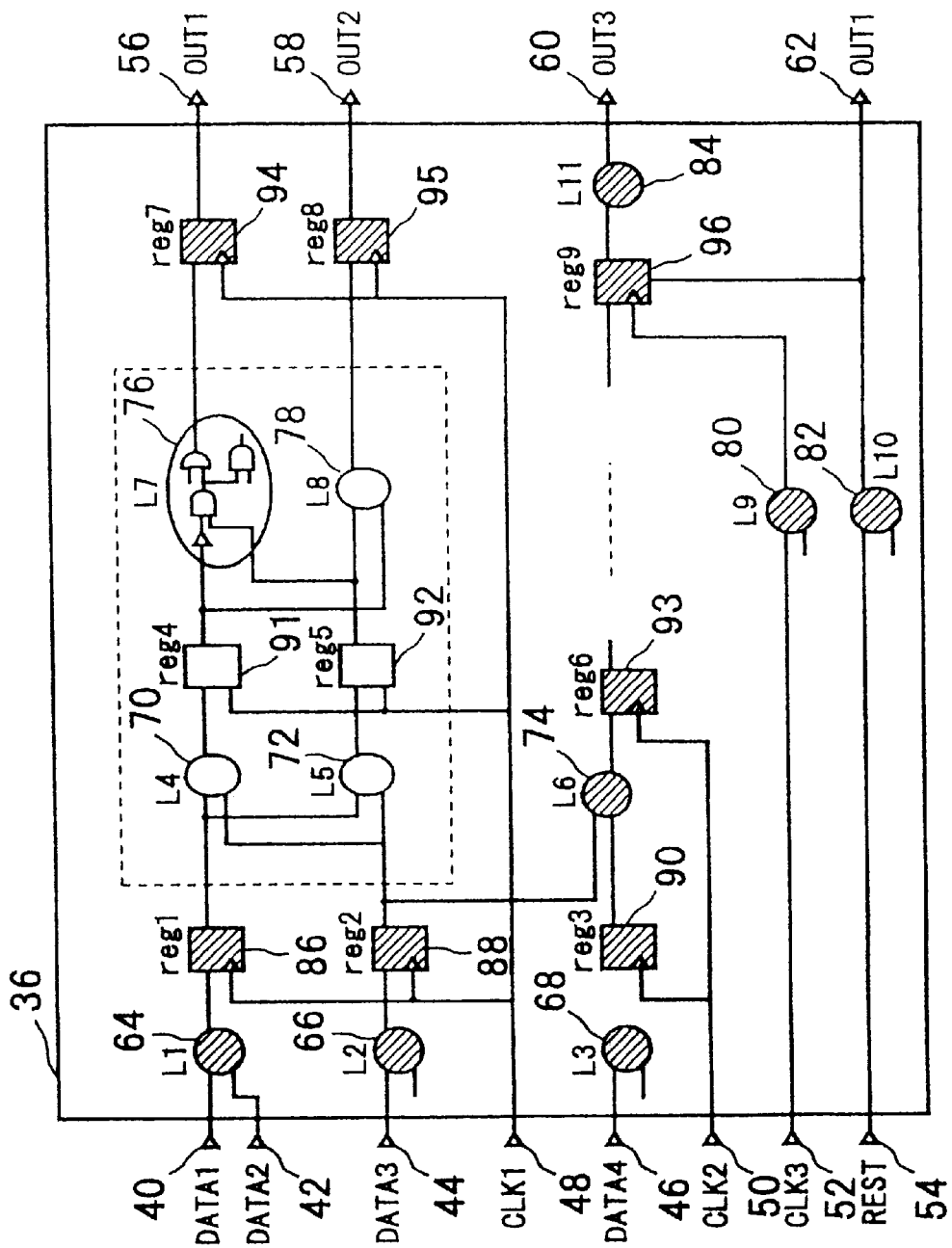
FIG. 3 is a block diagram showing the principal elements of the core shown is FIG. 2.

FIG. 3 is a block diagram showing the principal elements of the core 36. As shown in FIG. 3, on one side of the core 36 there are provided four data input pins 40, 42, 44 and 46, three clock signal input pins 48, 50 and 52, and one reset signal input pin 54. On the other side of the core 36 there are provided four data output pins 56, 58, 60 and 62.

In the core 36 there are provided a plurality of combinational logic gates 64 through 84 (L1 through L11). As can be seen in an illustration of a combinational logic gate 76 (L7), each of the combinational logic gates 64 through 84 is provided by combination of a plurality of gates such as AND gates and OR gates so as to perform a certain function. In the core 36 there are provided a plurality of registers 86 through 96 (i.e., reg 1 to reg 9). The registers 86 through 95 acquire data when detecting the edge of a clock signal and then output the thus-acquired data. In addition to the foregoing function, the register 96 has the function of resetting data upon detection of a reset signal.

Figure 4:
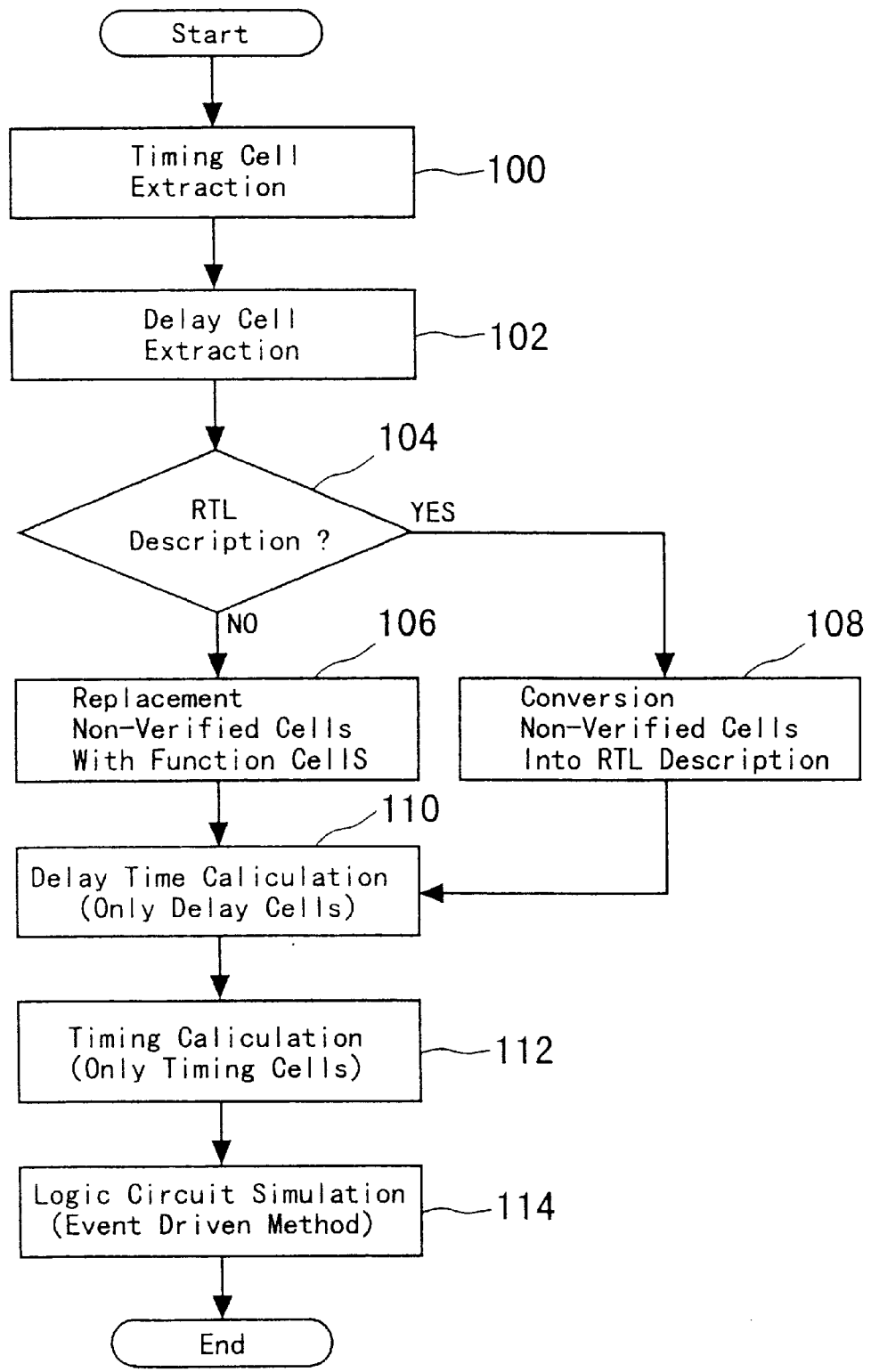
FIG. 4 is a flowchart showing a series of processing operations performed by the logic circuit verification apparatus according to the first embodiment.

FIG. 4 is a flowchart showing a series of processing operations performed for verifying the logic and timing of the semiconductor integrated circuit 34 by the logic circuit verification apparatus according to the first embodiment. In the series of processing operations shown in FIG. 4, the processing of step 100 is executed first.

In step 100, cells to be subjected to timing verification are extracted from among the cells of the core 36. The processing of step 100 is performed on the basis of the core-related net list stored in the logic circuit connection information section 10 shown in FIG. 1. The timing cell extraction section 12 shown in FIG. 1 is implemented through execution of the processing of step 100.

In the core 36 shown in FIG. 3, in order to cause the registers 86 through 96 (reg 1 to reg 9) to operate normally, the timing at which a clock signal and a reset signal supplied to the registers change and the timing at which a signal input to the registers changes must satisfy specific conditions. The timing verification should be performed with regard to such cells on which specific conditions regarding the changing timing of input signals are imposed, i.e., to the registers 86 through 96.

Among the registers of the core 36, the registers 91, 92 (reg 4 and reg 5) receive input signals generated based solely on the output signals of the registers 86, 88 (reg 1 and reg 2), and receive the same clock signal CLK1 as that used by the registers 86, 88. Accordingly, the registers 91, 92 constitute a synchronous circuit together with the registers 86, 88.

Similarly, the registers 94, 95 (reg 7 and reg 8) receive input signals based solely on the output signals of the registers 91, 92 (reg 4 and reg 5), and receive the same clock signal CLK 1 as that used by the registers 91, 92. Accordingly, the registers 94, 95 constitute a synchronous circuit together with the registers 86, 88 and 91, 92.

As mentioned above, logic circuit verification and timing verification of the core 36 have already finished. More specifically, it has already been verified that the registers 91, 92, 94, and 95 operate properly synchronously with the registers 86 and 88 so long as the registers 86 and 88 operate properly. Accordingly, during the logic circuit verification of the semiconductor integrated circuit 34, the four registers provided subsequent to the registers 86 and 88 can be omitted from registers to be subjected to timing verification. In the other wards, in the core 36, the register which receives input signal generated based solely on output signals of other registers which operate based on the same clock signal as that of the register can be omitted from cells to be subjected to timing verification The register 90 (reg 3) is a register which is provided at the first stage among registers which operate upon receipt of a clock signal CLK 2. Accordingly, the timing verification should be performed with regard to the register 90.

The register 93 (reg 6) is a register which is provided in the second stage among the registers which operate upon receipt of the clock signal CLK 2. However, the register 93 receives an input signal which is generated based on the output signal of the register 88 which operates synchronously with another clock signal CLK 1. For this reason, the timing verification should also be performed with regard to the register 93.

The register 96 is a register which is provided in the first stage among registers which operates upon receipt of a reset signal RES1. Accordingly, the timing verification should further be performed with regard to the register 96.

In step 100 shown in FIG. 4, cells to be subjected to the timing verification (timing cells) are extracted according to the foregoing standards by checking cells connected to each of the clock input pins 48 through 52 and the reset input pin 54 one by one, on the basis of the net list. In the present embodiment, the registers 86 to 90, 93, and 96 (reg 1 through reg 3, reg 6, and reg 9) are extracted as timing cells through execution of the foregoing processing, As mentioned above, the logic circuit verification apparatus according to the first embodiment enables only the cells truly required for checking the logic and timing of the semiconductor integrated circuit 34 to be extracted as timing cells. Therefore, the logic circuit verification apparatus according to the first embodiment enables a reduction in the amount of memory required for performing simulation of logic and timing verification and an effective reduction in the time required for performing the simulation.

As shown in FIG. 4, after completion of the processing of step 100, the processing of step 102 is performed.

In step 102, cells to be subjected to delay time calculation, i.e., delay cells are extracted from among the cells of the core 36. The processing of step 102 is performed on the basis of the core-related net list stored in the logic circuit connection information section 10. The delay cell extraction section 14 shown in FIG. 1 is implemented through execution of the processing of step 102.

To appropriately verify the timing of the cells extracted in step 100, there is required to accurately grasp the delay time arising on the way of propagation of signals from the data input pins 40 though 46 to the data input terminals of the timing cells (i.e., registers). Accordingly, in the core 36 according to the first embodiment, the cells constituting the combinational logic gates 64 to 68, 74, 80, and 82 should be extracted as delay cells.

Further, in a case where the semiconductor integrated circuit 34 is subjected to the logic circuit verification, there is a need to grasp as a delay time of the core 36 the relationship between the timing at which the clock signal and a set/reset signal are input and the timing at which the data output from the data output pins 56 to 62 of the core 36 change. The delay time of the core 36 changes according to the capacitance connected to the clock pins 48 to 52 and the data output pins 56 to 62. Accordingly, the delay time should be calculated in consideration of the circumstances of the core 36, i.e., the circumstances in which the core 36 is used in combination with the new circuit 38.

In the core 36, to the data output pins 56 to 60, there arrive data output from the registers 94 to 96 provided respectively in the final stages. In this case, the delay time arising in the respective data output pins 56 to 60 is generated due to the following delays:

(1) a delay arising on the way of propagation of a clock signal or a set/reset signal before arriving at the registers 94 to 96 provided in the final stage, (2) a delay arising due to the operation of the registers 94 to 96, and (3) a delay arising on the way of propagation of output signal of the registers 94 to 96 before arriving at the data output pins 56 to 60.

Accordingly, to calculate the delay time of the data output pins 56 to 60, such cells provided below should be extracted as delay cells.

(1) The registers 94 to 96 provided in the final stage, (2) Cells provided in the path along which the clock signal or the set/reset signal to be sent to the registers 94 to 96 propagate, and (3) Cells provided between the registers 94 to 96 and the data output pins 56 to 60.

In the core 36, the data output pin 62 receives a set/reset signal by way of a combinational logic gate 82 (L10). In this case, the delay time arising in the data output pin 62 is determined by a delay time stemming from the combinational logic gate 82. Accordingly, to calculate the delay time of the data output pin 62, the combinational logic gate 82 should be extracted as a delay cell.

In step 102 shown in FIG. 4, delay cells are extracted according to the previously-described standards on the basis of the net list. More specifically, in step 102, the following processing is performed.

(1) Extraction of cells provided between the data input terminals of the timing cells (i.e., the registers 86 to 90, 93, and 96) and the data input pins 40 to 46; and (2) Extraction of cells provided on the paths connecting the data output pins 56 to 62 with the clock signal input pins 48, 52 or with the reset signal input pin 54.

In the present embodiment, the combinational logic gates 64 to 68 and 74 (L1 to L3 and L6), the registers 94 to 96 (reg 7 to reg 9), and the combinational logic gates 80, 82, and 84 (L9, L10, and L11) are extracted as delay cells (i.e., the cells to be subjected to delay time calculation) through execution of the foregoing processing.

As mentioned above, the logic circuit verification apparatus according to the first embodiment enables only the cells truly required for checking the logic and timing of the semiconductor integrated circuit 34 to be extracted as delay cells from among the cells of the core 36. As a result, the logic circuit verification apparatus according to the first embodiment enables a reduction in the amount of memory required for performing simulation of logic and timing verification and an effective reduction in the time required for performing the simulation.

As shown in FIG. 4, after completion of the processing of step 102, the processing of step 104 is performed.

In step 104, it is determined whether or not there is an RTL description related to the core 36. As a result, in a case where it is decided that there is no RTL description, the processing of step 106 is executed next. In contrast, in a case where it is decided that there is an RTL description, the processing of step 108 is performed.

In step 106, non-verified cells are extracted from the cells of the core 36, and the information regarding the thus-extracted cells is replaced with the information regarding function cells. In the first embodiment, as a result of execution of the processing of step 106, the operations of the non-verified cell extraction section 16 and the function cell replacement section 22 shown in FIG. 1 are implemented.

In a case where the core 36 is subjected to the processing, as a result of execution of the processing of step 106, the cells located in the area surrounded by a dotted line in FIG. 3, i.e., the cells constituting the combinational logic gates 70, 72, 76, and 78 (L4, L5, L7, and L8) and the registers 91 and 92 (reg 4 and reg 5), are extracted as non-verified cells. There is no need to calculate the timing verification value or the delay time calculation value again with regard to those cells extracted in step 106 during the verification of the logic and timing of the semiconductor integrated circuit 34. In short, so long as there is obtained solely information regarding the function of these cells, the logic and timing of the semiconductor integrated circuit 34 can be verified.

Figure 5:
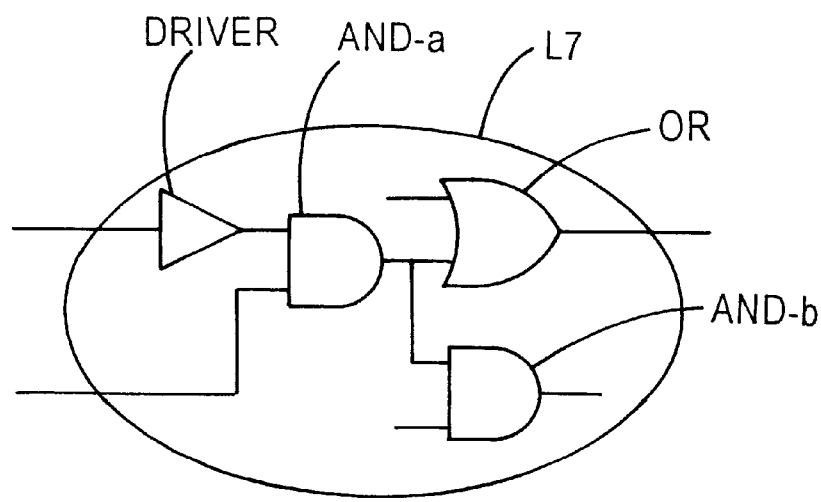
FIG. 5 shows a circuit diagram of a combinational logic gate shown in FIG. 3 on the basis of an information of a net list.

FIG. 5 shows a circuit diagram of a combinational logic gate 76 (L7) indicated on the basis of the net list. A group of cells shown in FIG. 5 constitute a portion of the cells extracted as non-verified cells in the present embodiment. In FIG. 5, "DRIVER," "AND-a," "AND-b," and "OR" are names of individual non-verified cells. The names are assigned so that dissimilarities among the cells in terms of function, drive capability, delay characteristics, or the like can be identified based on the names. For example, AND-b is a macro cell which has a twice drive capability of that of AND-a.

Figure 6:
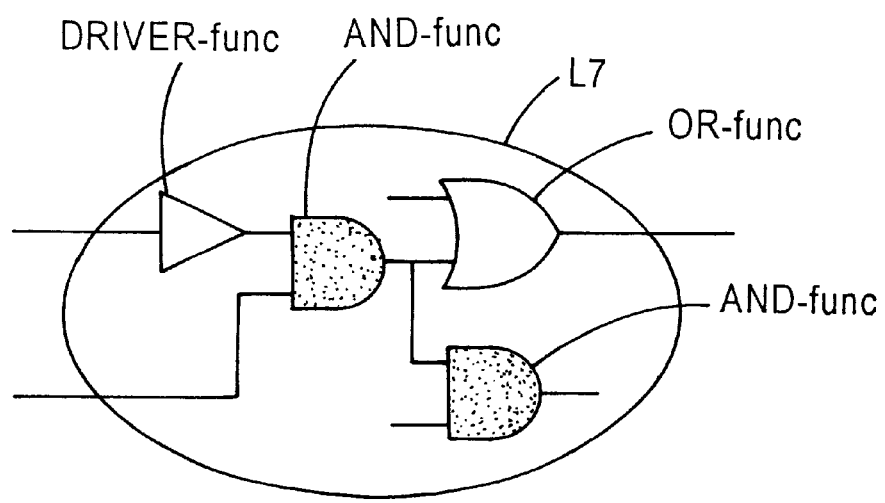
FIG. 6 is a circuit diagram showing a combinational gate in which the group of cells shown in FIG. 5 are replaced with function cells.

FIG. 6 is a circuit diagram showing a combinational gate 76 (L7) in which the group of cells shown in FIG. 5 are replaced with function cells. In FIG. 6, "DRIVER-func," "AND-func," and "OR-func" are names assigned to individual cells. The name represents the function of the cell. In step 106 shown in FIG. 4, all the cells extracted as non-verified cells are replaced with function cells such as those shown in FIG. 6 through use of the replacement cell information stored in the replacement cell information library 20.

As mentioned above, the logic circuit verification apparatus according to the first embodiment enables to proceed the logic circuit verification in a manner where the information regarding the non-verified cells included in the core 36 is limited to the information solely regarding function thereof. Accordingly, the logic circuit verification apparatus according to the present embodiment enables a reduction in the amount of memory required for performing simulation of logic and timing verification and an effective reduction in the time required for performing the simulation.

In step 108, non-verified cells are extracted from the cells of the core 36, and the information regarding the thus-extracted cells is converted into RTL descriptions. In the present embodiment, as a result of execution of the processing of step 108, the operations of the non-verified cell extraction section 16 and the RTL description conversion section 26 shown in FIG. 1 are implemented.

Figure 7:
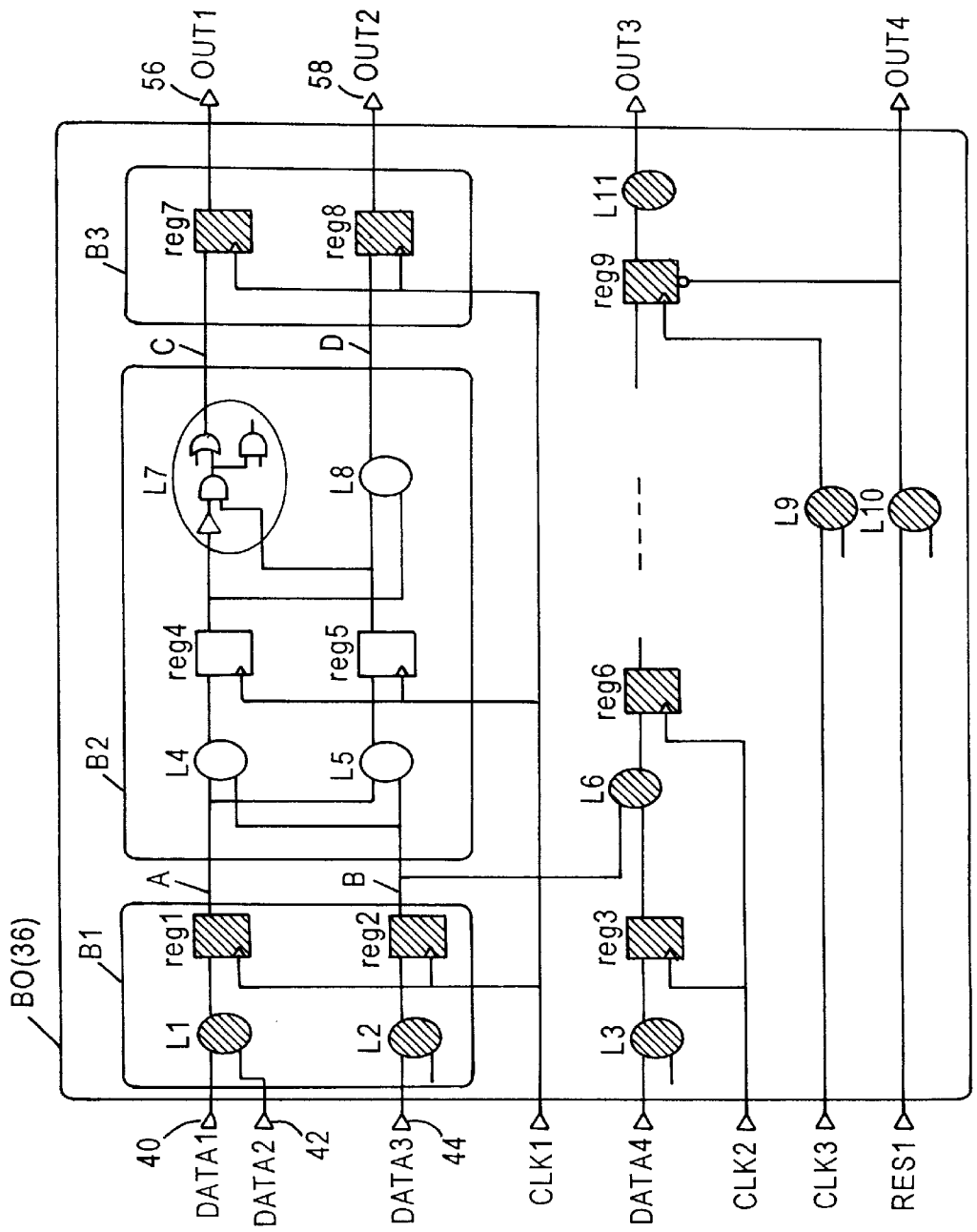
FIG. 7 is a circuit diagram of the core in which the circuit shown in FIG. 3 is separated to a plurality of modules.

FIG. 7 is a circuit diagram of the core 36 for describing the details of the processing performed in step 108. In FIG. 7, a module B0 comprises all the logic circuits included in the core 36. The logic circuits included in the module B0 can be divided into appropriate logic blocks such as those represented by modules B1 to B3. In FIG. 7, the module B2 is constituted of the cells which are extracted as the non verified cells in the present embodiment. In FIG. 7, reference symbols A, B, C, and D are assigned to input and output pins of the module B2.

FIG. 8 shows one example of RTL description in which the information regarding the logic circuit of the module B0 is described in a manner of Verilog-HDL. The RTL description shown in FIG. 8 comprises information such as that described below.

(1) Information regarding input and output pins (from the second line "B0(CLK 1, . . . ) to the sixth line OUT2;"),
(2) Information regarding the number of bits of a bundle of data lines connected to the registers (the seventh and eighth lines), and
(3) Information regarding input signals supplied to the registers (from the twelfth line "reg 1<. . . " to the fifteenth line ". . . /reg2;").

In a case where there is the RTL description shown in FIG. 8, there can be obtained an RTL description corresponding to the information regarding the logic circuit constituted of the non-verified cells included in the core 36 by extracting an RTL description regarding the module B2.

FIG. 9 shows an RTL description regarding the non-verified cells obtained by assigning the A, B, C and D to the input and output pins of the module B2 and extracting an RTL description regarding the module B2 from the RTL description shown in FIG. 8.

The RTL description shown in FIG. 9 comprises information such as that shown below.

(1) Information regarding input and output pins (from the first to the fourth lines),
(2) Information regarding the number of bits of a bundle of data lines connected to the registers (reg 4 and reg 5) (the fifth line),
(3) Information regarding signals supplied to the registers (reg 4 and reg 5) (the seventh line "reg 4<=A*B" and the eighth line "reg 5<=A/B"), and
(4) Information regarding signals supplied to data output pins (C, D) (the tenth line "assign C=reg 4 * reg 5" and the eleventh line "assign D=reg 4/reg 5").

From the information described in section (3) of the information items included in the RTL description shown in FIG. 9, it is understood that the signal supplied to the reg 4 corresponds to the result of multiplication of the signals input to the input pins A and B. Accordingly, from that information, it is obvious that the combinational logic gate L4 provided prior to reg 4 is a multiplier. Similarly, from the information described in section (3), it is understood that the combinational logic gate L5 positioned prior to reg 5 is a divider.

From the information described in section (4) of the information items included in the RTL description shown in FIG. 9, it is understood that the signal supplied to the output pin C corresponds to a result of multiplication of an output from reg 4 and an output from reg 5. Accordingly, from that information, it is obvious that the combinational logic gate L7 provided prior to the output pin C is a multiplier. Similarly, from the information described in section (4), it is understood that the combinational logic gate L8 positioned prior to the output pin D is a divider.

As mentioned above, the RTL description includes information regarding the function of the combinational logic gate. The combinational logic gate is constituted of a combination of a plurality of cells. Accordingly, in a case where the function of the combinational logic gate is obvious, the combinational logic gate including a plurality of cells can be handled as one cell. For this reason, through use of the information of RTL description, simulation of a circuit can be performed more efficiently as compared with a case where only the information regarding the function of an individual cell is used.

The RTL description shown in FIG. 9 does not include the detailed information, i.e., the information required for calculation of a delay time and a timing verification value with regard to individual cells constituting the module B2. However, the module B2 is constituted solely of non-verified cells. Therefore, even if the detailed information is unknown, the simulation of the semiconductor integrated circuit 34 can be performed without any hitch. Accordingly the simulation of the semiconductor integrated circuit 34 including non-verified cells can be efficiently performed without any hitch so long as the information of RTL description is used.

As mentioned previously, the logic circuit verification apparatus according to the first embodiment replaces the information regarding the non-verified cells with the RTL description in a case where there is an RTL description related to the core 36 (step 108). For this reason, the logic circuit verification apparatus according to the first embodiment enables a reduction in the amount of memory required for performing simulation of logic and timing verification and an efficient reduction in the time required for performing the simulation.

As shown in FIG. 4, after completion of the processing of step 106 or 108, the processing of step 110 is performed.

In step 110, there is calculated a delay time of only the delay cells, and a delay time of 0sec is assigned to the other cells. Delay time of a cell can be determined as a function of capacities "a" and "b" added to the input and output terminals of the cell. The logic circuit verification apparatus is previously given a functional equation f(a, b) used to calculate a delay time. In step 110, the delay time is calculated by substitution of a suitable capacity "a" and "b" into the functional equation.

In step 112, there is calculated timing verification values, i.e., standard values such as a set-up time and a hold time to ensure proper operations solely for the timing cells. Timing verification values set for cells can be calculated as a function of capacity "a" connected to the input terminal of the cells. The logic circuit verification apparatus is previously given a functional equation g(a) used to calculate a timing verification value. In step 112, the timing verification value is calculated by substitution of a suitable capacity "a" into the functional equation.

In step 114, logic circuit simulation is performed in order to check the logic and timing of the semiconductor integrated circuit 34. Namely, in step 114, there is performed a logic circuit simulation, for example, in an event-driven method, using an RTL description in a case where there is the RTL description related to the core 36. In contrast, there is performed logic circuit simulation using a net list stored in the logic circuit connection information section 10 in a case where there is no RTL description related to the core 36.

More particularly, in step 114, a delay simulation with regard to the delay cells is performed through use of the delay time calculated in step 110. Moreover, in step 114, timing verification operations are performed in order to check for proper operation of the timing cells through use of the timing verification value calculated in step 112.

In the present embodiment, the timing verification operations are performed while the information regarding the signal input to the external input pins of the core 36 is retained. If the timing verifications are performed while the information regarding the external input pin is retained as mentioned previously, at the time of detection of a timing error, the information regarding the external input pins and the input signals related to the timing error can be readily acquired. The external pin information retaining section 32 shown in FIG. 1 is implemented by the foregoing processing performed by the logic circuit verification apparatus.

The proper operation of the internal circuit of the core 36 has already verified. Accordingly, the timing error arising in the core 36 is attributable solely to the change timing of the signals supplied to external input pins of the core 36. If a timing error arises in the core 36, therefore, there is need to specify which of the external input pins are involved in the timing error and to prevent the timing error from being carried at the stages prior to the external input pins.

In a case where timing verification is performed without retaining the information regarding the external input pins of the core 36, it is required to trace back the circuit from the cell which caused the timing error to specify the external pins involved in the timing error. In contrast, in a case where timing verification is performed while the information regarding the external input pin of the core 36 is retained, the external input pins involved in the timing error can be readily specified without the circuit being traced back.

So long as the external input pin can be specified without the circuit being traced back, the time required for tracing the circuit can be reduced. Further, in this case, since the core 36 can be handled as a black box, even in a case where the internal structure of the core 36 is unknown, the circuit verification of the core 36 can be performed. As mentioned previously, the logic circuit verification apparatus according to the present embodiment has the function of performing timing verification while retaining the information regarding the external input pins and the function of displaying the information regarding the external input pins and the signals involved in a timing error in the event of the timing error arising in the core 36. By virtue of these functions, the logic circuit verification apparatus according to the present embodiment enables an effective reduction in the time required for subjecting the semiconductor integrated circuit 34 to logic circuit verification.

Although in the present embodiment the RTL description is formatted in the ASCII type, the format type is not limited to ASCII type. The RTL description may be formatted in a binary type formed by encryption of ASCII. If the RTL description is encrypted, high-speed logic circuit verification can be implemented while the security of the core 36 is ensured.

Since the present invention is configured as mentioned previously, the invention provides the following advantageous results.

According to the first aspect of the present invention, cells to be subjected to timing verification (i.e., timing cells) and cells to be subjected to delay time calculation (i.e., delay cells)—both of which are required for subjecting a semiconductor integrated circuit to logic circuit verification—can be extracted from a core having already been subjected to internal circuit verification.

According to the second aspect of the present invention, cells subjected to neither timing verification nor delay time calculation, i.e., non-verified cells are extracted from the cells of the core. Further, the information regarding the non-verified cell is reduced to the information solely regarding to the function of an individual cell. As a result, the present invention enables a reduction in the amount of memory required for performing logic circuit verification and an increase in the speed of processing.

According to the third aspect of the present invention cells subjected to neither timing verification nor delay time calculation, i.e., non-verified cells are extracted from the cells of the core. Further, the information regarding the non-verified cell is converted to an RTL description. As a result, the present invention enables a reduction in the amount of memory required for performing logic circuit verification and an increase in processing speed.

According to the fourth aspect of the present invention, timing verification is performed for no cell of the core but timing cells during logic circuit verification of the semiconductor integrated circuit. As a result, the present invention enables prevention of useless timing verification, thereby effectively reducing the time required for performing logic circuit verification.

According to the fifth aspect of the present invention, delay simulation is performed for no cell of the core but delay cells during logic circuit verification of the semiconductor integrated circuit. As a result, the present invention enables prevention of useless delay simulation, thereby effectively reducing the time required for performing logic circuit verification.

According to the sixth aspect of the present invention, information regarding external input pins and signals, both of which are involved in a timing error can be easily obtained in the event of the timing error arising in the core. As a result, the present invention enables the core to be handled as a black box and an effective reduction in the time required for logic circuit verification.

Further, the present invention is not limited to these embodiments, but variations and modifications may be made without departing from the scope of the present invention.

The entire disclosure of Japanese Patent Application No. Hei10-180248 filed on Jun. 26, 1998 including specification, claims, drawings and summary are incorporated herein by reference in its entirety.

What is claimed is:

1. A logic circuit verification apparatus which performs logic circuit verification of a semiconductor integrated circuit which comprises a core having a plurality of combinational logic gates and a plurality of registers and whose internal circuit has already verified, and a new circuit to be combined with the core, said logic circuit verification apparatus comprising:

a timing cell extraction section for extracting from the cells of the core timing cells which are required to be subjected to timing verification when the core is used in combination with the new circuit; and a delay cell extraction section for extracting from the cells of the core delay cells which are required to be subjected to time delay calculation when the core is used in combination with the new circuit.

2. The logic circuit verification apparatus as defined in claim 1, further comprising:

a non-verified cell extraction section for extracting as non-verified cells from the cells of the core cells which are required to be subjected to neither timing verification nor time delay calculation when the core is used in combination with the new circuit; and a function cell replacement section which replaces information regarding the non-verified cells with information regarding solely the function of the cells.

3. The logic circuit verification apparatus as defined in claim 1, further comprising:

a non-verified cell extraction section for extracting as non-verified cells from the cells of the core cells which are required to be subjected to neither timing verification nor time delay calculation when the core is used in combination with the new circuit; and an RTL description conversion section which converts information regarding a module constituted of the non-verified cells into an RTL description.

4. The logic circuit verification apparatus as defined in claim 1, further comprising:

a timing calculation section which calculates timing verification values with regard to the timing cells; and a simulation section which performs simulation of timing verification of the timing cells through use of the timing verification value.

5. The logic circuit verification apparatus as defined in claim 1, further comprising:

a delay time calculation section which calculates a delay time with regard to the delay cells; and a simulation section which performs delay simulation of the delay cells through use of the delay time.

6. The logic circuit verification apparatus as defined in claim 1, further comprising:

a simulation section which performs timing verification of the semiconductor integrated circuit, and an external pin information retaining section which retains information regarding external input pins of the core during execution of the timing verification.

7. A method of logic circuit verification for performing logic circuit verification of a semiconductor integrated circuit which comprises a core having a plurality of combinational logic gates and a plurality of registers and whose internal circuit has already verified, and a new circuit to be combined with the core, said method comprising the steps for:

extracting from the cells of the core timing cells which are required to be subjected to timing verification when the core is used in combination with the new circuit; and extracting from the cells of the core delay cells which are required to be subjected to time delay calculation when the core is used in combination with the new circuit.

8. The method of logic circuit verification as defined in claim 7, further comprising the steps for:

extracting from the cells of the core non-verified cells which are required to be subjected to neither timing verification nor time delay calculation when the core is used in combination with the new circuit; and replacing information regarding the non-verified cells with information regarding solely the function of the cells.

9. The method of logic circuit verification as. defined in claim 7, further comprising the steps for:

extracting from the cells of the core non-verified cells which are required to be subjected to neither timing verification nor time delay calculation when the core is used in combination with the new circuit; and converting information regarding a module constituted of the non-verified cells into an RTL description.

10. The method of logic circuit verification as defined in claim 7, further comprising the steps for:

calculating timing verification values with regard to the timing cells; and performing simulation of timing verification of the timing cells through use of the timing verification value.

11. The method of logic circuit verification as defined in claim 7, further comprising the steps for:

calculating a delay time with regard to, the delay cells; and performing delay simulation of the delay cells through use of the delay time.

12. The method of logic circuit verification as defined in claim 7, further comprising the steps for:

performing timing verification of the semiconductor integrated circuit, and retaining information regarding external input pins of the core during execution of the timing verification.

* * * * *